US006882294B2

(12) United States Patent
Linder et al.

(10) Patent No.: US 6,882,294 B2
(45) Date of Patent: Apr. 19, 2005

(54) RESISTIVE LADDER, SUMMING NODE CIRCUIT, AND TRIMMING METHOD FOR A SUBRANGING ANALOG TO DIGITAL CONVERTER

(75) Inventors: Lloyd F. Linder, Agoura Hills, CA (US); Benjamin Felder, Rancho Palos Verdes, CA (US)

(73) Assignee: TelASIC Communications, Inc., El Segundo, CA (US)

( * ) Notice: Subject to any disclaimer, the term of this patent is extended or adjusted under 35 U.S.C. 154(b) by 0 days.

(21) Appl. No.: 10/635,826

(22) Filed: Aug. 6, 2003

(65) Prior Publication Data

US 2005/0030216 A1 Feb. 10, 2005

(51) Int. Cl.[7] ............................ H03M 1/78; H03M 1/36
(52) U.S. Cl. ........................................ 341/154; 341/156
(58) Field of Search .................................. 341/154, 156

(56) References Cited

U.S. PATENT DOCUMENTS 3,721,975 A * 3/1973 Brinkman et al. .......... 341/156
4,229,729 A * 10/1980 Devendorf et al. ......... 341/159
5,376,937 A * 12/1994 Colleran et al. ............ 341/159
5,589,831 A * 12/1996 Knee .......................... 341/159
5,973,631 A 10/1999 McMullen et al.
6,437,724 B1 * 8/2002 Nagaraj ...................... 341/159

* cited by examiner

*Primary Examiner*—Howard L. Williams
(74) *Attorney, Agent, or Firm*—Morrison & Foerster LLP

(57) ABSTRACT

A subranging analog to digital converter (ADC). The ADC (200) includes a novel resistive ladder (56) for a differential quantizer (50) and a novel summing node circuit (150). The novel resistive ladder (56) includes an input terminal (52), a plurality of serially connected resistors R coupled to the input terminal (52), and a pair of complementary current sources (66 and 68) for maintaining a constant current flow through the ladder (56). The novel summing node circuit (150) includes an input terminal (152) for receiving an input signal, a pair of complementary DACs (156 and 158) for generating a reconstruction signal, and a summing amplifier (164) for subtracting the reconstruction signal from the input signal to produce a residue signal.

The invention also includes a method for trimming the subranging ADC. The novel method (250) includes the steps of trimming the complementary current sources of the coarse quantizer to match each other (252), trimming each of the DAC cells on one of the complementary DACs (254), trimming the overall DAC gain to match the gain of the coarse quantizer (256); and trimming the gain of the fine quantizer to match one coarse quantization Q level (260).

64 Claims, 11 Drawing Sheets

FIG. 4
(Prior Art)
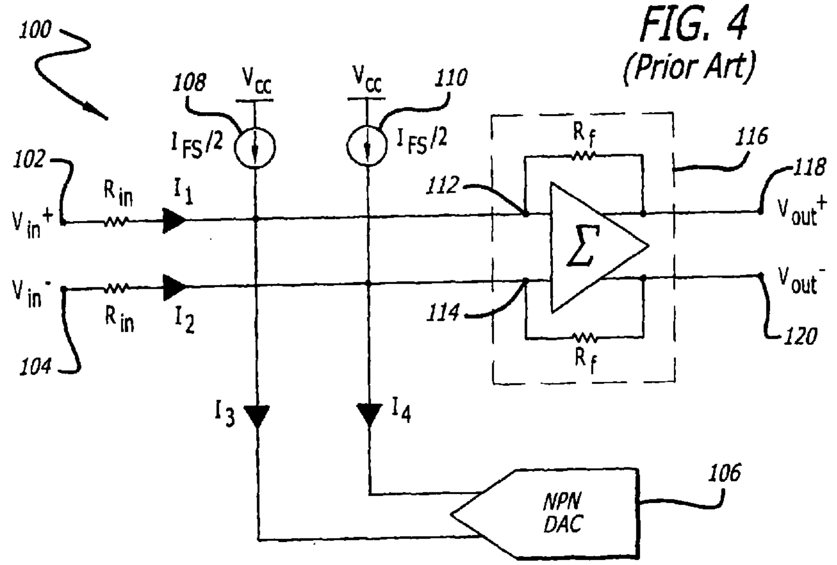
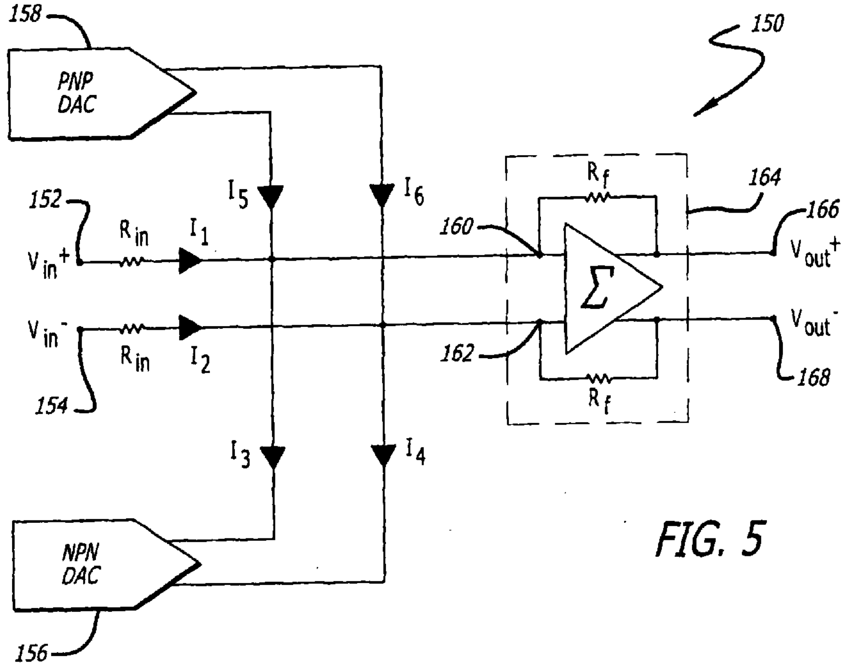
FIG. 5

RESISTIVE LADDER, SUMMING NODE CIRCUIT, AND TRIMMING METHOD FOR A SUBRANGING ANALOG TO DIGITAL CONVERTER

BACKGROUND OF THE INVENTION

1. Field of the Invention

The present invention relates to electronics. More specifically, the present invention relates to analog to digital converters.

2. Description of the Related Art

The function of an analog to digital converter (ADC) is to accurately convert an analog input signal into a digital output represented by a coded array of binary bits. The output bits are generated by processing the analog input signal through a number of comparator steps. An N-bit digital output can be produced in one step with $2^N$-1 parallel comparators (flash ADCs) or, at the limit, by N sequential steps with a single comparator (successive approximation ADCs). Flash ADCs provide higher speed of conversion, but are limited by higher input capacitance, power consumption, and device yield constraints associated with the high number of comparators in the circuitry. At the other extreme, successive approximation ADCs are simple in structure, and may be very accurate, but they have very slow conversion times due to the serial nature of the conversion process.

Subranging ADCs provide an intermediate compromise between flash ADCs and successive approximation ADCs. Subranging ADCs typically use a low resolution flash quantizer during a first or coarse pass to convert the analog input signal into the most significant bits (MSB) of its digital value. A digital to analog converter (DAC) then generates an analog version of the MSB word, which is subtracted from the input signal at a summing node to produce a residue or residual signal. The residue signal is sent through one or more fine passes (through the same quantizer or additional low resolution quantizers) to produce the lower significant bits of the input signal. The lower significant bits and the MSB word are combined by digital error correcting circuitry to produce the desired digital output word.

There is a requirement to produce high dynamic range, low power ADC integrated circuits (IC) for the military communications market, as well as for commercial applications such as the cellular basestation market. Currently available ADCs do not meet the needs of the marketplace.

In particular, typical flash or subranging ADCs may utilize a flash quantizer for quantizing the analog signal. It is often preferable to use a differential signal path to improve system performance. Prior art differential quantizers typically include two equal resistor ladders that spread the positive and negative inputs of the differential analog input signal. Each resistor ladder includes a plurality of serially connected resistors and a single reference current source for maintaining a uniform current. A bank of comparators then compares signals tapped from both resistor ladders. In the prior art quantizer, the current sources are employed as current sinks, which loads down the hold amplifier driving the quantizer and requires too much power. Hence, there is a need in the art for an improved quantizer that requires less power than prior art quantizers.

In addition, subranging ADCs typically include a summing node circuit to generate the residue signal. Conventional summing node circuits include offset current sources and a DAC to generate an analog signal representing the coarse pass of the ADC, which is subtracted from the input signal by a summing amplifier to produce the residue signal. This design dissipates too much power, plus the offset current sources are noisy and bandlimited, which creates settling problems with the offset currents. Hence, there is a need in the art for an improved summing node design for subranging ADCs that requires less power than prior art approaches.

Furthermore, subranging ADCs may exhibit significant nonlinearity errors that tend to repeat in response to an analog input signal. The repetition produces spurs in the ADC's frequency response that distort the signal and reduce its spur free dynamic range. Because the spurs tend to lie very close to the signal frequency, it is difficult and expensive to remove them using conventional filtering techniques. New trim methodologies for reducing the static differential nonlinearity (DNL) and integral nonlinearity (INL) are required in order to achieve the desired performance. Hence, there is a need in the art for a system or method for trimming a subranging ADC.

SUMMARY OF THE INVENTION

The need in the art is addressed by the subranging ADC of the present invention. The ADC includes a novel resistive ladder for a differential quantizer and a novel summing node circuit. The novel resistive ladder includes an input terminal, a plurality of serially connected resistors coupled to the input terminal, and a pair of complementary current sources for maintaining a constant current flow through the ladder. The novel summing node circuit includes an input terminal for receiving an input signal, a pair of complementary DACs for generating a reconstruction signal, and a summing amplifier for subtracting the reconstruction signal from the input signal to produce a residue signal.

The invention also includes a method for trimming the subranging ADC. The novel method includes the steps of trimming the complementary current sources of the coarse quantizer to match each other, trimming each of the DAC cells on one of the complementary DACs, trimming the overall DAC gain to match the gain of the coarse quantizer; and trimming the gain of the fine quantizer to match one coarse quantization Q level.

BRIEF DESCRIPTION OF THE DRAWINGS

FIG. 4 is a schematic of a classic sum node configuration of conventional design and construction.

FIG. 5 is a schematic of an illustrative embodiment of a summing node circuit designed in accordance with the teachings of the present invention.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

In order to reduce the power of the ADC IC, new circuit architectures are required to be developed that take advantage of present day process technologies. Specifically, present day BiCMOS, or complementary bipolar, or CBiCMOS, can be utilized to reduce the power associated with the flash quantizer structure and the summing node circuit. Complementary bipolar process technologies have been developed that have NPN and PNP bipolar devices with the same transit frequency $F_T$. Previously, the $F_T$ of the PNP device was much slower than that of the NPN, by a factor of two to four. This $F_T$ match allows for the development of novel circuit architectures that were previously unachievable.

1. Resistive Ladder for a Differential Flash Quantizer

Figure 1:
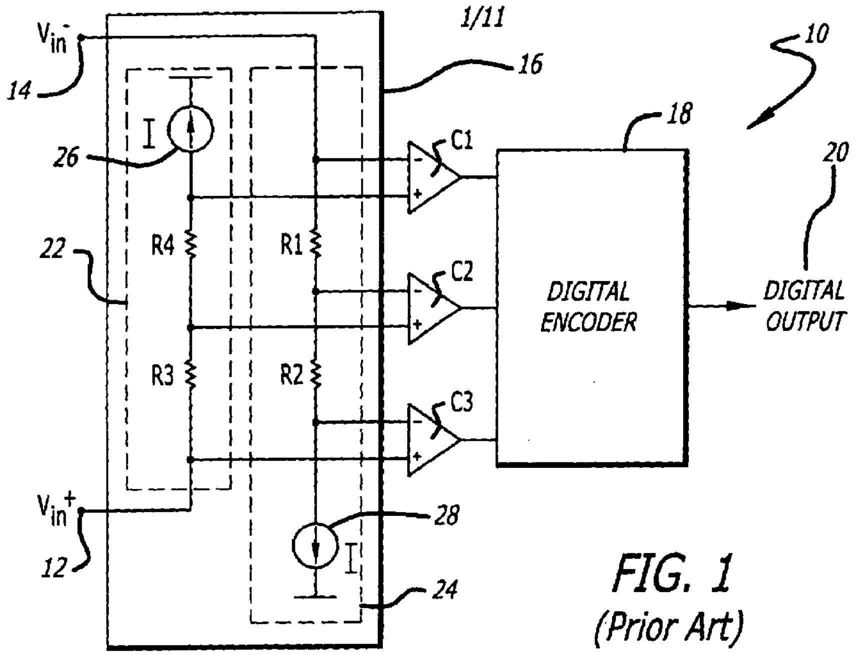
FIG. 1 is a schematic of a typical differential quantizer as used in the prior art.

FIG. 1 is a schematic of a typical differential quantizer 10 as used in the prior art. The quantizer 10 receives a differential analog signal and converts the signal to a digital output. The conventional quantizer 10 includes positive and negative input terminals 12 and 14 for receiving the differential analog signal, a resistive spreading network 16, a plurality of comparators C1, C2, and C3, and a binary encoder 18.

The differential resistive spreading network 16 spreads the differential analog input signal amongst the comparators C1, C2, and C3. The resistive network 16 includes two equal and independent resistor ladders 22 and 24, which spread the positive and negative inputs of the analog differential input signal. Each resistor ladder 22 and 24 has a plurality of serially connected resistors (R3 and R4 in the first resistor ladder 22, and R1 and R2 in the second resistor ladder 24) of equal value R, and further includes a reference current source 26 and 28 of value I for maintaining a uniform current. The comparators C1, C2, and C3 compare signals tapped from both resistor ladders 22 and 24. The outputs of the comparators C1, C2, and C3 are coupled to a binary encoder 18 for providing a binary output word 20.

With the prior art quantizer 10, there is current on only one leg 22 or 24 of the resistive network 16. For this approach, the quantization step size Q=IR. There is a voltage drop of $Q(2^{N-1})$, which equals half of the full scale voltage. This causes a headroom problem when the quantizer needs a large voltage swing to achieve SNR (signal to noise ratio) while maintaining a small voltage supply. Additionally, the delay to the end of a single-ended leg is $(2^{N-1}R)(C)$. Plus, the current sources 26 and 28 are employed as current sinks, which will load down the hold amplifier driving the quantizer.

Figure 2:
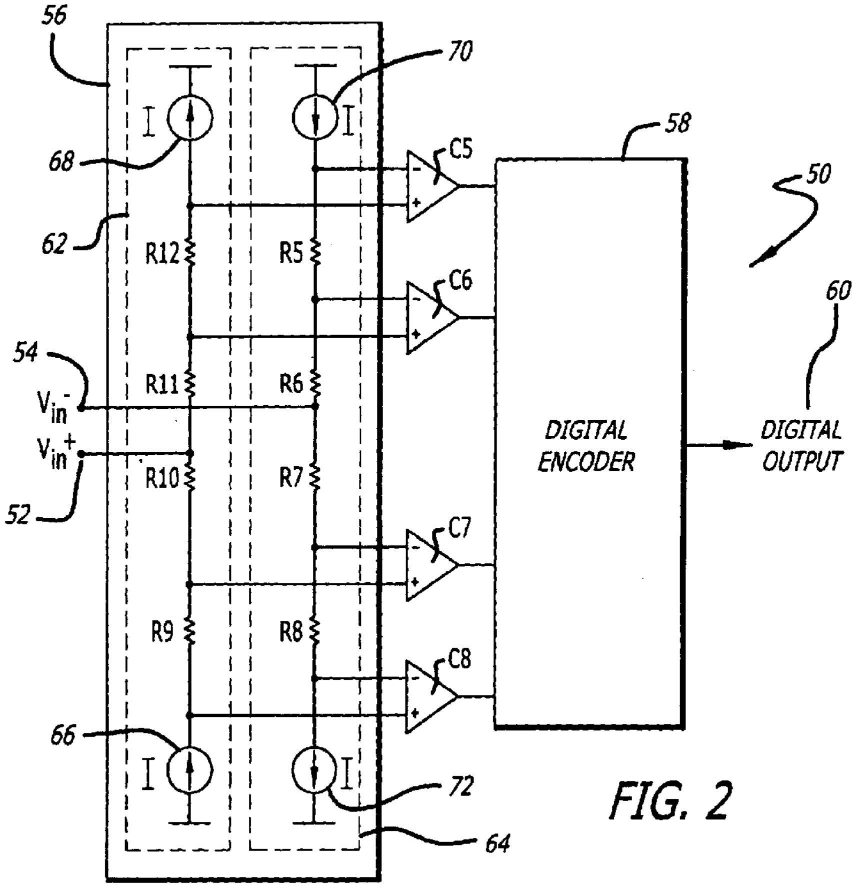
FIG. 2 is a schematic of an illustrative embodiment of a differential quantizer designed in accordance with the teachings of the present invention.

FIG. 2 is a schematic of an illustrative embodiment of a differential quantizer 50 designed in accordance with the teachings of the present invention. The quantizer 50 receives a differential analog signal and converts the signal to a digital output. The quantizer 50 includes positive and negative input terminals 52 and 54 for receiving a differential analog input signal, a novel resistive spreading network 56 designed in accordance with the present teachings, a plurality of comparators C5, C6, C7, and C8, and a binary encoder 58.

The novel resistive network 56 includes two equal and independent resistor ladders 62 and 64, which spread the differential analog input signal and provide a plurality of comparison signals. The first resistor ladder 62 is coupled to the positive input terminal 52, and the second resistor ladder 64 is coupled to the negative input terminal 54.

The first resistor ladder 62 includes a plurality of serially connected resistors (four resistors R9, R10, R11, and R12 are shown in the illustrative embodiment of FIG. 2), which spread the input signal and provides a first set of comparison signals at each node of the ladder 62 (other than the input node 52). In accordance with the teachings of the present invention, a pair of complementary current sources 66 and 68 of value I is coupled to the ends of the ladder 62, one current source at each end, for maintaining a steady uniform current. For instance, if implemented in complementary bipolar technology, one current source 66 would be a PNP device, while the other current source 68 would be an NPN device. Similarly, in BiCMOS, one current source 66 could be PMOS, while the other 68 could be NMOS. The transit frequency $F_T$ of the first current source 66 should be on the same order as the $F_T$ of the second current source 68.

In accordance with the teachings of the present invention, the input 52 is injected in the middle of the ladder 62 between two resistors R10 and R11, rather than at an end of the ladder as in the prior art. The two resistors R10 and R11 next to the input 52 have a resistance value half that of the other resistors (R9 and R12 in the example) in the ladder. In the illustrative embodiment, the resistors R10 and R11 have resistances of R/4, while the other resistors R9 and R12 have resistances of R/2.

Similarly, the second resistor ladder 64 includes a plurality of serially connected resistors (four resistors R5, R6, R7, and R8 are shown in the illustrative embodiment of FIG. 2), which spread the input signal and provides a second set of comparison signals at each node of the ladder 64 (other than the input node 54). A second pair of complementary current sources 70 and 72 of value I is coupled to the ends of the ladder 64, one current source at each end, for maintaining a steady uniform current. The input 54 is injected in the middle of the ladder 64 between two resistors R6 and R7. The two resistors R6 and R7 next to the input 54 have a resistance value half that of the other resistors (R5 and R8 in the example) in the ladder. In the illustrative embodiment, the resistors R6 and R7 have resistances of R/4, while the other resistors R5 and R8 have resistances of R/2.

Thus, there are complementary current sources 66, 68 and 70, 72 in each leg 62 and 64 of the resistive network 56. This allows the quantization step size Q to be defined as 21(R/2)=Q=IR differentially, as opposed to a single ended definition, as is the case for the prior art. The time constant for the end of each leg is equal to $(2^{N-1})$(R/2)(C). This is an improvement of a factor of two over prior art differential ladder circuits for the same power consumption. The voltage drop at each end is (Q/2)$(2^{N-1})$, which equals a quarter of the full scale voltage, so there is a factor of two improvement in DC headroom. Furthermore, since the current in each leg is equal, there is no loading effect on the holding amplifier driving the quantizer.

The comparators C5, C6, C7, and C8 compare the first set of comparison signals from the first resistor ladder 62 with the second set of comparison signals from the second resistor ladder 64. In the illustrative embodiment, the comparator C5 compares the signal at the node between the NPN current source 68 and the resistor R12 of the first ladder 62, with the signal at the node between the PNP current source 70 and the resistor R5 of the second ladder 64. The comparator C6 compares the node between the resistor R12 and the resistor R11 of the first ladder 62, with the node between the resistor R5 and the resistor R6 of the second ladder 64. The comparator C7 compares the node between the resistor R10 and the resistor R9 of the first ladder 62, with the node between the resistor R7 and the resistor R8 of the second ladder 64. The comparator C8 compares the node between the resistor R9 and the PNP current source 66 of the first ladder 62, with the node between the resistor R8 and the NPN current 72 source of the second ladder 64. The outputs of comparators C5, C6, C7, and C8 are coupled to a binary encoder 58 for providing an N-bit binary output word 60.

Note that the comparators are offset from the differential inputs 52 and 54. Prior art differential ladders do not offset the comparators from the differential input. See in FIG. 1, for example, that the negative input terminal 14 is connected directly to the comparator C1, and the positive input terminal 12 is connected directly to the comparator C3. This may cause the comparators to toggle when the input level is below a coarse Q level. The new architecture of the present invention offsets the comparators to fix this problem.

Figure 3:
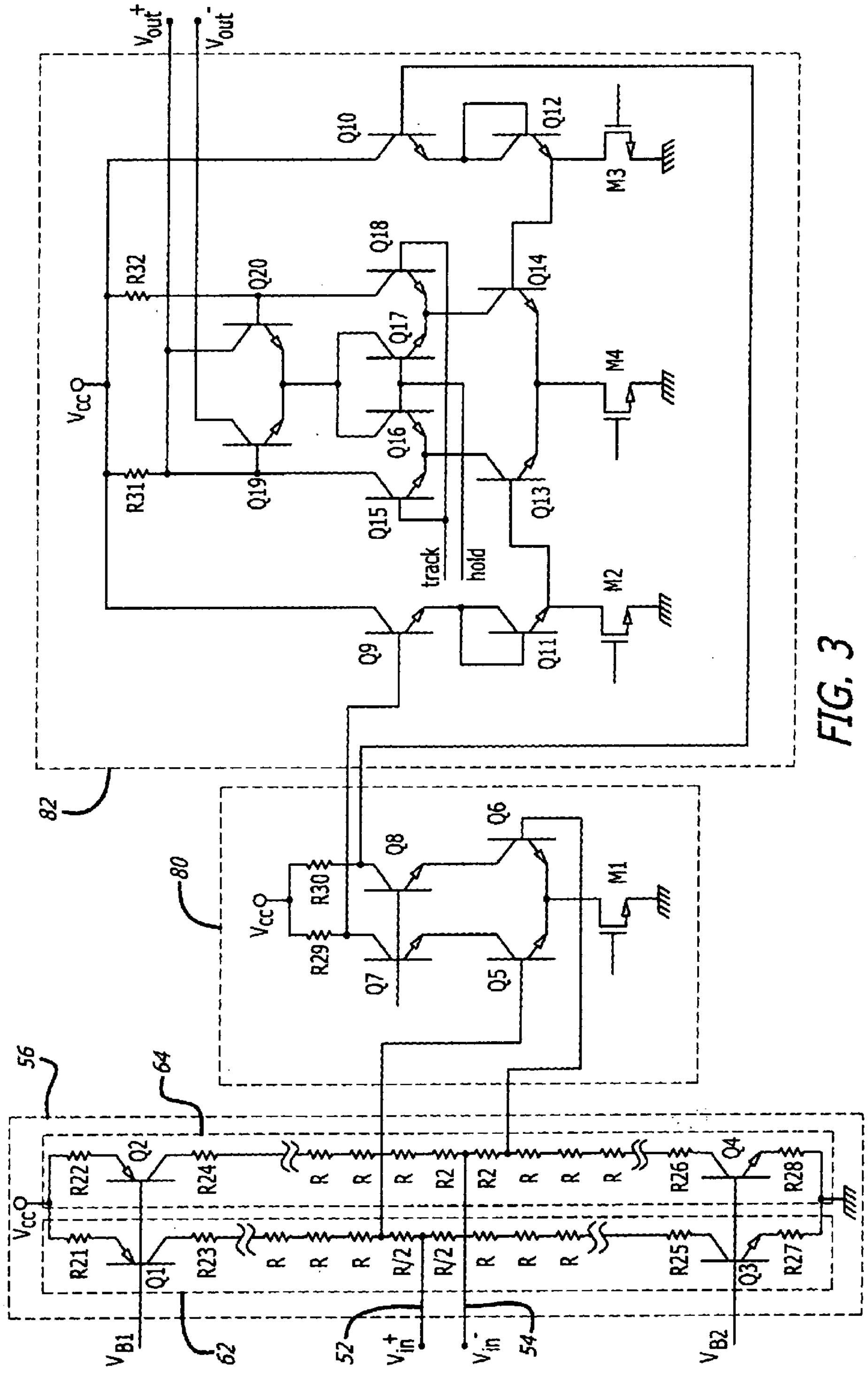
FIG. 3 is a schematic of an illustrative embodiment of a differential ladder driving a pre-amplifier and comparator in accordance with the teachings of the present invention.

FIG. 3 is a schematic of an example of a differential ladder 56 driving a comparator pre-amplifier 80 and comparator 82 in accordance with the teachings of the present invention. The differential ladder network 56 includes a positive resistor ladder 62 and a negative resistor ladder 64, each ladder including a plurality of resistors R connected in series and complementary current sources 66, 68 and 70, 72. (Note that the positive ladder 62 in this drawing is flipped vertically from that of FIG. 2, with the PNP current source 66 at the top of the figure and the NPN source 68 at the bottom.) The inputs 52 and 54 are injected into the middle of the ladders 62 and 64, each between two resistors R/2. In this example, the current sources 66 and 70 of the differential ladder 56 are implemented as PNP current sources Q1 and Q2 in complementary bipolar process. The current sources 66 and 70 could also be PMOS in BiCMOS process. The collectors of the transistors Q1 and Q2 are connected to the positive and negative resistor ladders 62 and 64 by resistors R23 and R24, and the emitters are connected to a voltage supply $V_{CC}$ by resistors R21 and R22. The bases of the transistors Q1 and Q2 are connected to a biasing voltage $V_{B1}$.

The complementary current sources 68 and 72 are implemented as NPN current sources Q3 and Q4 in complementary bipolar process. The current sources 68 and 72 could also be NMOS in BiCMOS process. The collectors of the transistors Q3 and Q4 are connected to the positive and negative resistor ladders 62 and 64 by resistors R25 and R26, and the emitters are connected to ground by resistors R27 and R28. The bases of the transistors Q3 and Q4 are connected to a biasing voltage $V_{B2}$.

The comparison signals from the differential ladder 56 are output to comparator pre-amplifiers 80, which amplify the signals before directing them to comparators 82 (only one pre-amplifier 80 and comparator 82 are shown for simplicity). A comparator pre-amplifier 80 may be implemented as shown, using an NPN differential pair Q5 and Q6 for receiving the outputs from the differential ladder 56. The emitters of the transistors Q5 and Q6 are both connected to an NMOS current source M1, and the collectors are coupled to NPN transistors Q7 and Q8. The collectors of Q7 and Q8 are output to the comparator 82, and also to Vcc through resistors R29 and R30, respectively.

The example comparator 82 shown is implemented using a pair of NPN transistors Q9 and Q10 for receiving the outputs from the pre-amplifier 80. The collectors of Q9 and Q10 are connected to $V_{CC}$, and the emitters are coupled to NMOS current sources M2 and M3 through diode connected NPN transistors Q11 and Q12. The emitters of Q11 and Q12 are connected to an NPN differential pair Q13 and Q14. The emitters of Q13 and Q14 are connected together to an NMOS current source M4, and the collectors are each connected to a pair of NPN transistors Q15, Q16 and Q17, Q18, respectively. The collector of Q15 is connected to the base of an NPN transistor Q19, and the collector of Q18 to the base of an NPN transistor Q20. The collectors of Q16 and Q17 are connected together to the emitters of Q19 and Q20. The base of Q19 is connected to the collector of Q20, to $V_{CC}$ through a resistor R31, and to an output $V_{out}^+$. The base of Q20 is connected to the collector of Q19, to $V_{CC}$ through a resistor R32, and to an output $V_{out}^-$.

Although the implementation of FIG. 3 is shown as CBiCMOS (complementary bipolar and CMOS), it can be implemented in other technologies such as BiCMOS or complementary bipolar without departing from the scope of the present teachings. The comparators can be implemented using NPN or PNP devices, depending on the transit frequency $F_T$ of the process technology, the DAC architecture used (in a subranging ADC), and the decode logic. For instance, PNP comparators may be used to drive an NPN DAC, and NPN comparators may be used to drive a PNP DAC for symmetry.

While the resistor ladder of the present invention has been described with reference to a differential flash quantizer for a subranging ADC, the invention is not limited thereto. The circuit may be used in other applications without departing from the scope of the present teachings.

2. Summing Node Circuit

The present invention also includes a novel summing node circuit for subranging ADCs, which requires half the power of prior art summing nodes by taking advantage of the availability of a truly complementary bipolar technology.

FIG. 4 is a schematic of a classic sum node configuration 100 of conventional design and construction. The prior art circuit 100 includes positive and negative input terminals 102 and 104 for receiving a differential input voltage. Each input terminal is connected to a resistor $R_{in}$, which converts the input voltages $V_{in}^+$ and $V_{in}^-$ to input currents $I_1$ and $I_2$. A DAC 106 generates two coarse currents $I_3$ and $I_4$ (an analog "reconstruction" of the signal from the coarse quantizer). One DAC current $I_3$ is coupled to the positive input current $I_1$ and a first offset current source 108 at a first summing node 112, and the second DAC current $I_4$ is coupled to the negative input current $I_2$ and a second offset current source 110 at a second summing node 114. The first and second summing nodes 112 and 114 are connected to the positive and negative inputs of a summing amplifier 116, which effectively subtracts the DAC signal from the input signal to produce a residue signal at its outputs 118 and 120. In a typical subranging ADC, the DAC 106 is implemented as switched NPN current sources, and the offset current sources 108 and 110 are implemented as fixed PNP current sources.

When the ADC 100 is at midscale, the input signal currents $I_1$ and $I_2$ are 0, and all of the currents are balanced. Each of the PNP current sources 108 and 110 are half the full scale current value $I_{FS}/2$, and the balanced DAC 106 produces half the full scale current $I_{FS}/2$ per side in balance ($I_3$ and $I_4$). At positive full scale (FS) for one of the differential inputs (negative FS for the other differential input), the positive input current $I_1$ is at $I_{FS}/2$, the negative input current $I_2$ is at $-I_{FS}/2$, and the output currents of the DAC $I_3$ and $I_4$ are at $I_{FS}$ and 0.

As discussed above, this design dissipates too much power, plus the offset current sources 108 and 110 are noisy and bandlimited, which creates settling problems with the offset currents.

FIG. 5 is a schematic of an illustrative embodiment of a summing node circuit 150 designed in accordance with the teachings of the present invention. The novel circuit replaces the PNP offset current sources and NPN DAC of the prior art with a pair of complementary DACs. In the illustrative embodiment, the complementary DACs include a PNP DAC and an NPN DAC implemented in bipolar process technology.

The novel circuit IS0 includes positive and negative input terminals 152 and 154 for receiving a differential input voltage. Each input terminal is connected to a resistor $R_{in}$, which converts the input voltages $V_{in}^+$ and $V_{in}^-$ to input currents $I_1$ and $I_2$. An NPN DAC 156 generates two coarse currents $I_3$ and $I_4$, which are coupled to two currents $I_5$ and $I_6$ generated by a PNP DAC 158 at a first summing node 160 and a second summing node 162, respectively. The first summing node 160 is connected to the positive input current $I_1$ and the positive input of a summing amplifier 164. The second summing node 162 is connected to the negative input current $I_2$ and the negative input of the summing amplifier 164. The summing amplifier 164 effectively subtracts the DAC currents from the input currents to produce a residue signal at its outputs 166 and 168. In the illustrative embodiment, the summing amplifier 164 is a transresistance amplifier for converting the input current signals into an output voltage $V_{out}^+$ and $V_{out}^-$.

At midscale, the input currents $I_1$ and $I_2$ are 0, and the DAC currents $I_3$, $I_4$, $I_5$ and $I_6$ are at $I_{FS}/4$. At full scale, the input currents $I_1$ and $I_2$ are at $I_{FS}/2$ and $-I_{FS}/2$, the PNP DAC currents $I_5$ and $I_6$ are at 0 and $I_{FS}/2$, and the NPN DAC currents $I_3$ and $I_4$ are at $I_{FS}/2$ and 0.

In comparing the currents between the prior art and the present invention, the complementary DAC structure acts as a class AB push-pull device, as opposed to the class A DAC structure of the prior art. This is the key advantage of the new circuit over the previous implementation. The availability of truly complementary process technology allows this solution to be feasible. By being push-pull, the complementary DAC structure is power efficient when compared to the prior art class A DAC summing node structure. The overall power of the sum node circuitry is reduced by 50%. This is critical, especially for three-pass subranging ADCs, which have two summing nodes. This will save DC power. The reduction in power also reduces any thermal effects with respect to self-heating and resultant settling errors in the circuitry. The complementary DAC structure reduces the amount of current required to be sustained by the sum node clamp, thereby reducing the transient thermal settling effects of the clamp. The removal of the PNP offset current sources removes potential slow settling errors that result from the offset current source bandwidth and settling time response, plus the noise of the PNP offset current sources is removed. The reduction in the full scale DAC current reduces the parasitic capacitance at the sum node, which improves the settling time of the summing amplifier.

Figure 6:
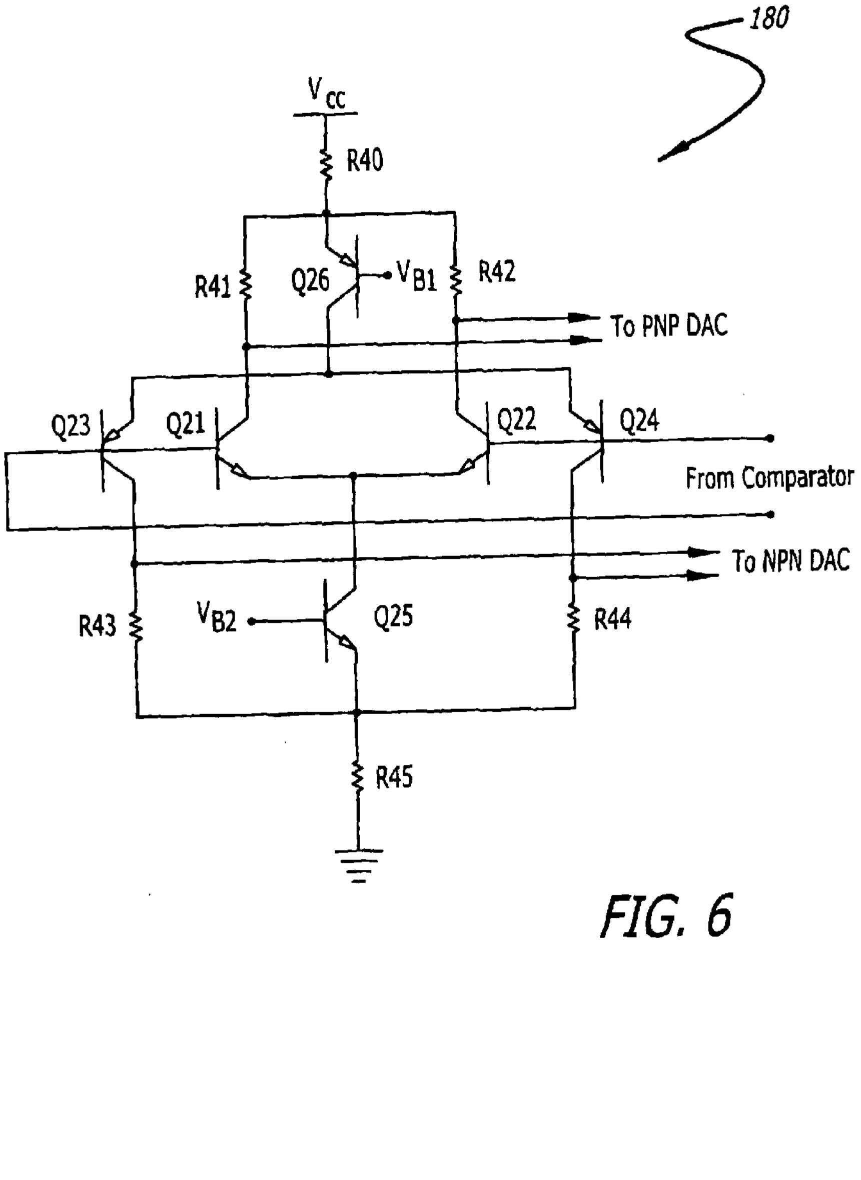
FIG. 6 is a schematic of a complementary driver circuit for driving the PNP DAC and NPN DAC of the summing node circuit in accordance with the teachings of the present invention.

FIG. 6 is a schematic of a complementary driver circuit 180 for driving the PNP DAC 158 and NPN DAC 156 in accordance with the teachings of the present invention. The output of a comparator from the coarse quantizer drives this circuit 180. The comparator outputs are input to an NPN differential pair Q21 and Q22 and a PNP differential pair Q23 and Q24. The emitters of NPN pair Q21 and Q22 are joined together and biased by an NPN transistor Q25, whose base is connected to $V_{B2}$ and emitter is connected to ground through a resistor R45. The emitters of PNP pair Q23 and Q24 are joined together and biased by a PNP transistor Q26, whose base is connected to $V_{B1}$ and emitter is connected to $V_{CC}$ through a resistor R40. The collectors of Q21 and Q22 are connected to R40 through resistors R41 and R42. The collectors of Q23 and Q24 are connected to R45 through resistors R43 and R44.

The collectors of the NPN pair Q21 and Q22 are output to drive a PNP DAC switch, and the collectors of the PNP pair Q23 and Q24 are output to drive an NPN DAC switch. In this manner, the circuitry is symmetric, or complementary, from the comparator output to the PNP and NPN DAC current outputs.

While the summing node configuration of the present invention has been described with reference to a subranging ADC, the invention is not limited thereto. The circuit may be used in other applications, such as a sigma-delta modulator, without departing from the scope of the present teachings.

3. Subranging ADC

The differential flash quantizer and/or the summing node circuit of the present invention can be used to create a high performance, low power subranging ADC.

Figure 7:
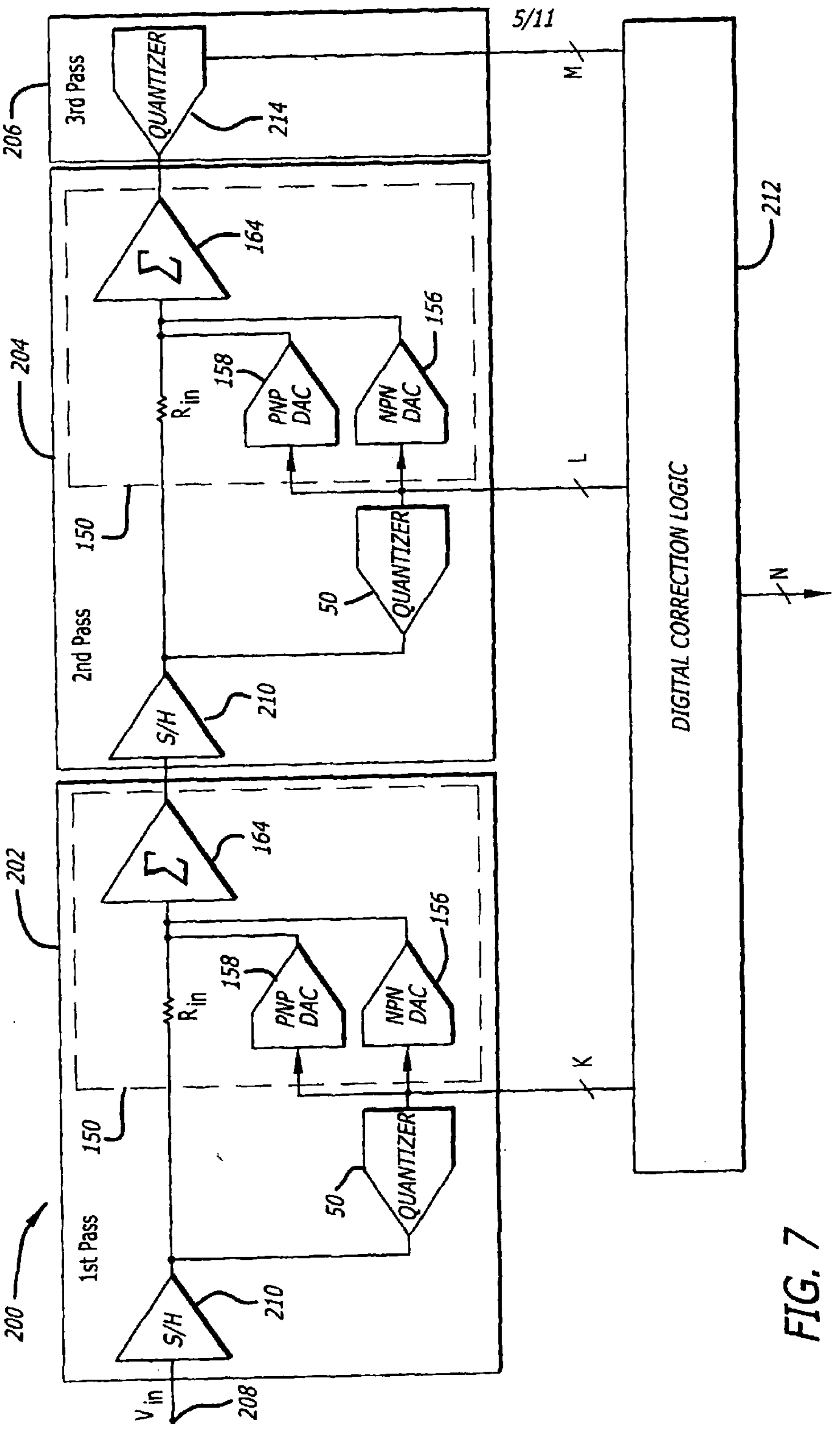
FIG. 7 is a simplified block diagram of an illustrative subranging ADC designed in accordance with the teachings of the present invention.

FIG. 7 is a simplified block diagram of an illustrative subranging ADC 200 designed in accordance with the teachings of the present invention. A single-ended architecture is shown in FIG. 7 for simplicity. The principles discussed are applicable to single-ended or differential implementations. In a preferred embodiment, the circuit is implemented with a differential architecture.

The ADC 200 includes a coarse pass, one or more optional intermediate passes, and a fine pass. In accordance with the teachings of the present invention, the ADC includes a differential ladder quantizer with complementary current sources (as described in section 1) or a summing node circuit with complementary DACs (as described in section 2). In a preferred embodiment, the coarse and intermediate passes of the ADC each includes both the novel quantizer and the novel summing node circuit of the present invention, and the fine pass includes the novel quantizer.

In the illustrative embodiment of FIG. 7, a three-pass ADC 200 is shown with a first (coarse) pass 202, a second (intermediate) pass 204, and a third (fine) pass 206. An analog input voltage $V_{in}$ is input to the first pass circuit 202 at an input terminal 208. In the preferred embodiment, the input signal is a differential signal and the input terminal 208 includes positive and negative terminals. A sample and hold (S/H) or track and hold circuit 210 produces a sample voltage, which is fed to a quantizer 50 and a summing node circuit 150. The quantizer 50 produces the K most significant bits (MSB) of the sampled voltage. In the preferred embodiment, the quantizer 50 is a differential ladder quantizer with complementary current sources (as described in section 1). The MSB word is output to a digital correction circuit 212 and the DAC(s) 156 and 158 of the summing node circuit 150. The summing node circuit 150 subtracts an analog version of the MSB word from the input signal to produce a residue signal that is fed to the second pass 204. In the preferred embodiment, the summing node circuit 150 includes complementary DACs 156 and 158 (as described in section 2).

The second pass circuit 204 is identical or similar to the first pass circuit 202. In some designs, the second pass 204 may in fact be a second pass through the first circuit 202. The second pass circuit 204 quantizes the residue signal from the first pass 202 to produce the L most significant bits of the residue signal, which are passed to the digital correction circuit 212. An analog version of the L-bit word is subtracted from the first pass residue signal to produce a second pass residue signal that is fed to the third pass circuit 206.

The third pass circuit 206 is the final fine pass of the ADC 200. It includes a quantizer 214, which quantizes the second pass residue signal to produce the M least significant bits of the original input signal. In the preferred embodiment, the quantizer 214 is a differential ladder quantizer with complementary current sources (as described in section 1). The M-bit word is output to the digital correction circuit 212, which combines the K-, L-, and M-bit words from the first, second, and third passes to produce and output an N-bit word representing the original input signal.

4. Trim Methodology

Several parts of the subranging ADC 200 require dynamic trims in order to reduce the static differential nonlinearity (DNL) and integral nonlinearity (INL) of the converter. This can be accomplished by either trimming thin film resistors, or by adjusting digital calibration circuitry, such as CMOS calibration DACs. The calibration DACs can be controlled through a digital serial interface or be hardwired by blowing laser links during calibration at wafer probe, or the trim codes can be stored in EEPROM (the location of EEPROM can be on the same chip, or an external chip, depending on the IC technology used). The required trims can be broken up into subblocks consisting of each of the subranging elements. These include the quantizer, the DAC, and the summing amplifier.

Figure 8:
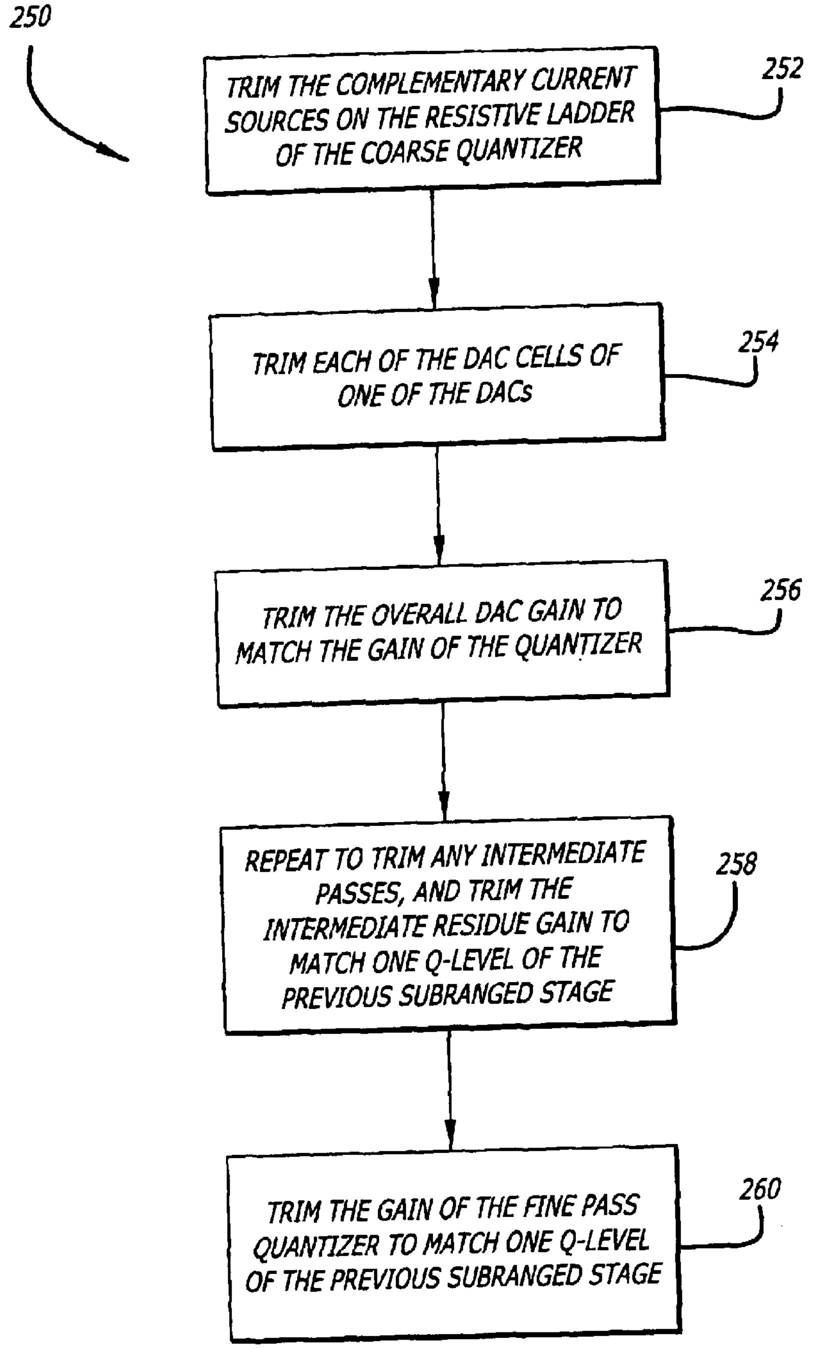
FIG. 8 is a flow chart of a method for trimming a subranging ADC in accordance with the teachings of the present invention.

FIG. 8 is a flow chart of a method 250 for trimming a subranging ADC in accordance with the teachings of the present invention. The method is described with reference to an illustrative three-pass ADC 200, as shown in FIG. 7, with a 5-bit quantizer 50 and 5-bit complementary unary DACs 156 and 158 for each of the first and second passes 202 and 204, and a 6-bit quantizer 214 for the third pass 206. However, the methodology described can be used on any data converter in any process technology without departing from the scope of the present teachings.

At Step 252, trim the complementary current sources (68, 70) and (66, 72) on the differential reference ladder 56 of the coarse quantizer 50 (shown in detail in FIG. 2). The positive and negative reference currents need to be trimmed so that they match. This can be done several ways.

Figure 9:
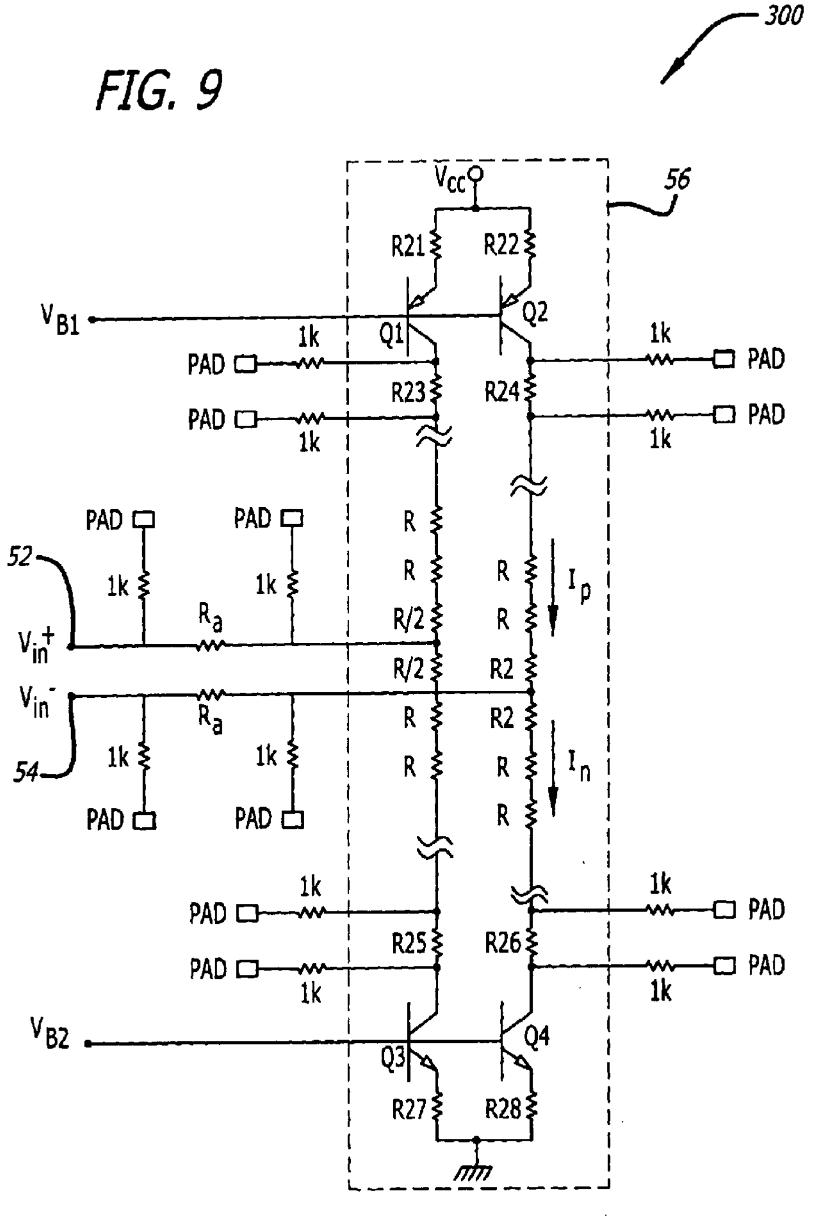
FIG. 9 is a schematic for an illustrative circuit for trimming a differential ladder quantizer designed in accordance with the teachings of the present invention.

FIG. 9 is a schematic for an illustrative circuit 300 for trimming the differential ladder 56 of a quantizer 50 (as shown in FIG. 3). The circuit shown is complementary bipolar, but can easily be implemented in BiCMOS. As shown, each sense resistor R23, R24, R25, and R26 at the collectors of the currents sources Q1, Q2, Q3, and Q4 can have a series 1 kΩ resistor to the pad on either side. The currents can be adjusted, for example, in Q1 to match Q2, and Q3 to match Q4.

A resistor $R_a$ can be used at each of the positive and negative input terminals 52 and 54 to make sure all of the currents are matched. This, however, causes a parasitic RC in the signal path, so it may not be desirable to perform this check. It may be sufficient to trim each pair of transistors (Q1, Q2) and (Q3, Q4).

There are several ways to actually adjust the current in each leg. One way is to separately trim each current by laser trimming the emitter resistor R21, R22, R27, and R28 of each current source Q1, Q2, Q3, and Q4. Another way is to adjust the currents through the use of a programmable CMOS DAC that connects to the emitters of Q1, Q2, Q3, and Q4. The pre-amplifier off of the ladder must have small standing currents and large β, so that β mismatch does not degrade the DNL and INL of the quantizer.

Figure 10:
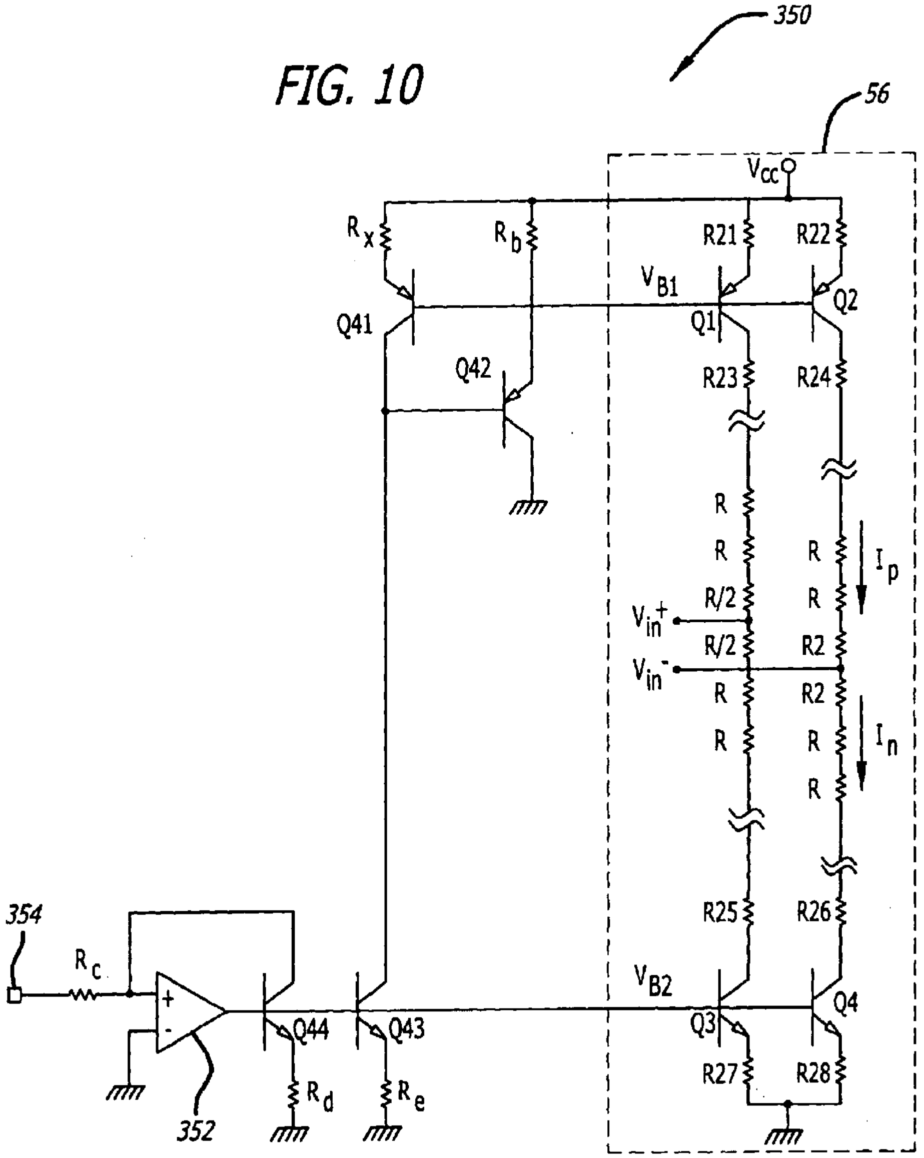
FIG. 10 is a schematic for an illustrative circuit for trimming the overall gain of a differential ladder quantizer designed in accordance with the teachings of the present invention.

FIG. 10 is a schematic for an illustrative circuit 350 for trimming the overall gain of the quantizer 50. With this reference set-up, the current $I_p$ from the PNP sources and the current $I_n$ to the NPN sources are adjusted together. This can also be set up so that $I_p$ and $I_n$ are adjusted separately, or $V_{B1}$ can be adjusted after $V_{B2}$, or vice versa. The base of a PNP transistor Q41 and the emitter of a PNP transistor Q42 are connected to $V_{B1}$, the bases of the PNP current sources Q1 and Q2 of the differential ladder 56, and to $V_{CC}$ through a resistor $R_b$. The emitter of Q41 is connected to $V_{CC}$ through a resistor $R_x$, and the collector of Q42 to ground. The collector of Q41 and the base of Q42 are connected together to the collector of an NPN transistor Q43. The base of Q43 is connected to the base of an NPN transistor Q44, to the output of an op amp 352, and to $VB_2$, the bases of the NPN current sources Q3 and Q4 of the differential ladder 56. The emitters of Q43 and Q44 are connected to ground through resistors $R_c$ and $R_d$, respectively. The negative input terminal of the op amp 352 is connected to ground, and the positive terminal to the collector of Q44 and to a bandgap pin 354 through a resistor $R_c$.

Figure 11:
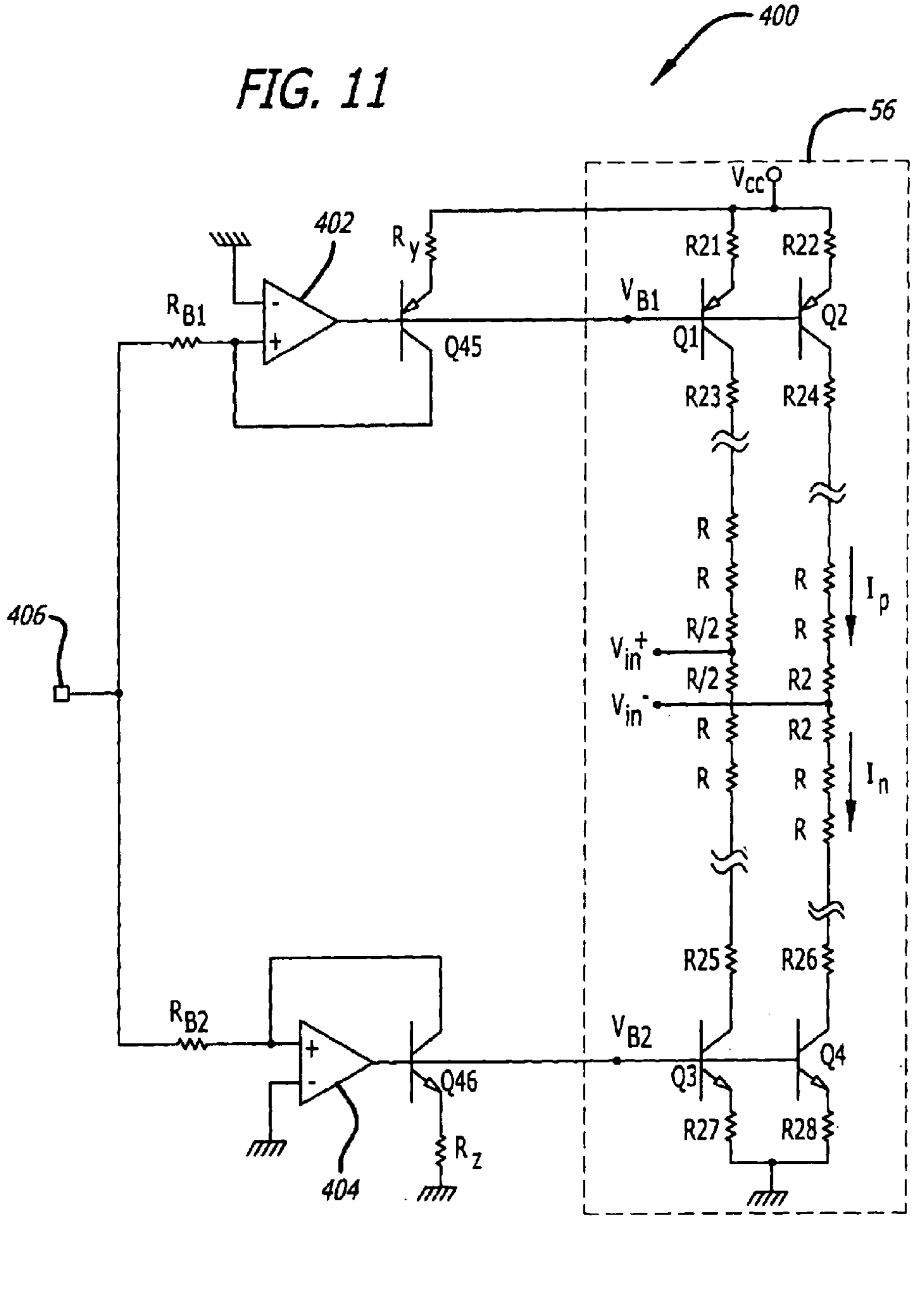
FIG. 11 is a schematic for an illustrative circuit for separately trimming the biases $V_{B1}$ and $V_{B2}$ of a differential ladder quantizer designed in accordance with the teachings of the present invention.

FIG. 11 is a schematic for an illustrative circuit 400 for trimming the biases $V_{B1}$ and $V_{B2}$ of the quantizer 50 separately. The output of a first op amp 402 is fed to $V_{B1}$ and the base of a PNP transistor Q45, the negative terminal is connected to ground, and the positive terminal to the collector of Q45 and to a bandgap pin 406 through a resistor $R_{B1}$. The emitter of Q45 is connected to $V_{CC}$ through a resistor $R_y$. The output of a second op amp 404 is fed to $V_{B2}$ and the base of an NPN transistor Q46, the negative terminal is connected to ground, and the positive terminal to the collector of Q46 and to a bandgap pin 406 through a resistor $R_{B2}$. The emitter of Q46 is connected to ground through a resistor $R_z$. The individual gains can be adjusted by laser trimming $R_{B1}$ or $R_{B2}$. Or, again, a digitally programmable CMOS DAC can inject a current into either reference loop in order to adjust each individual reference in the reference amplifier shown in FIG. 11 or FIG. 10.

Figure 12A:
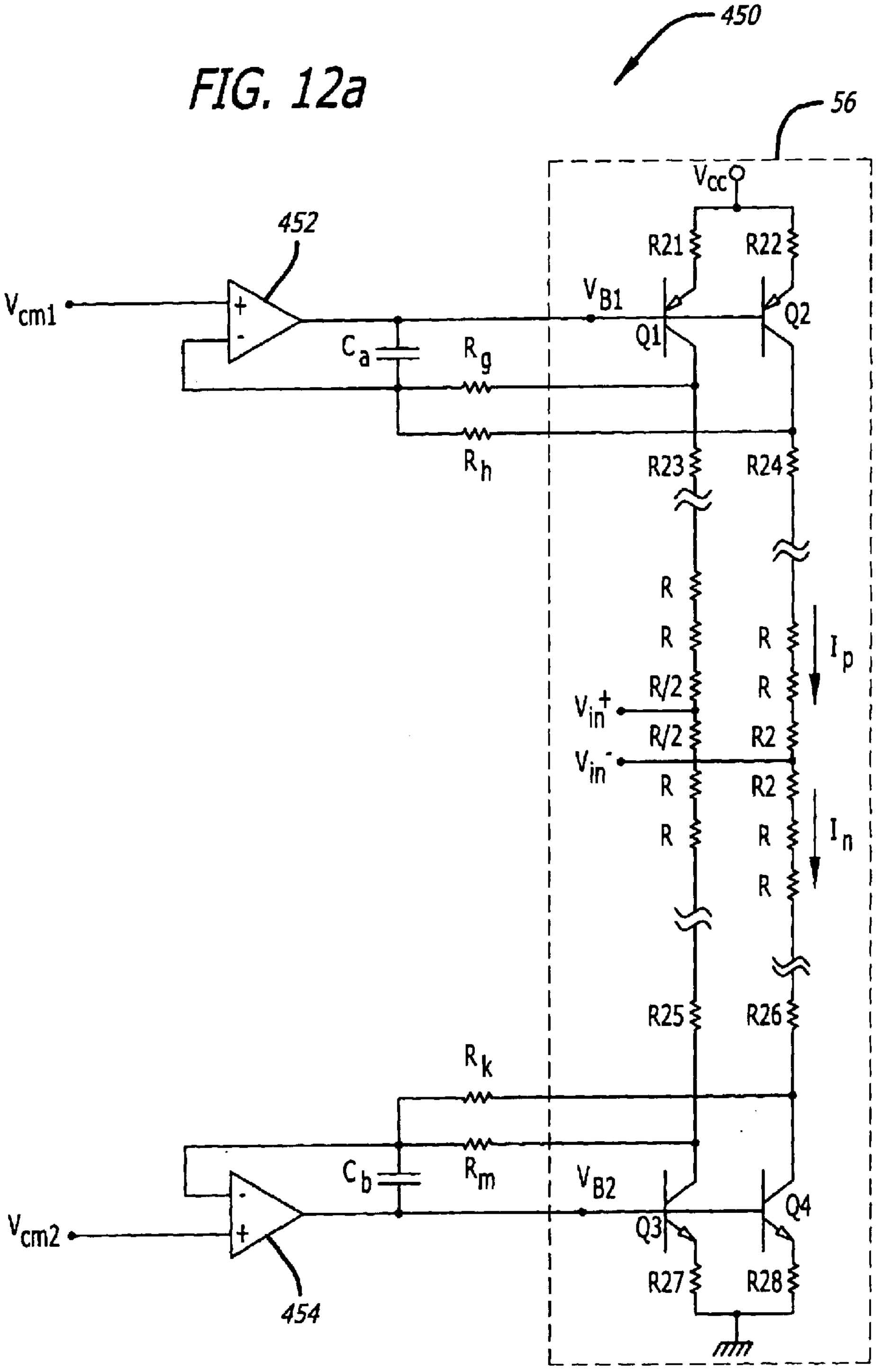
FIG. 12*a* is a schematic of an illustrative circuit for automatically trimming a differential ladder quantizer designed in accordance with the teachings of the present invention.

The quantizer 50 may be automatically trimmed using a control loop. FIG. 12*a* is a schematic of an illustrative circuit 450 for automatically trimming the differential ladder 56 of a quantizer 50. The output of a first op amp 452 is connected to $V_{B1}$, and one end of a capacitor $C_a$. The negative terminal of the op amp 452 is connected to the other end of the capacitor $C_a$, to the collector of Q1 through a resistor $R_g$, and to the collector of Q2 through a resistor $R_h$ (where $R_g=R_h$). The positive terminal of the op amp 452 is connected to a voltage $V_{cm1}$. The output of a second op amp 454 is connected to $V_{B2}$, and one end of a capacitor $C_b$. The negative terminal of the op amp 454 is connected to the other end of the capacitor $C_b$, to the collector of Q3 through a resistor $R_m$, and to the collector of Q4 through a resistor $R_k$ (where $R_m=R_k$). The positive terminal of the op amp 454 is connected to a voltage $V_{cm2}$.

Figure 12B:
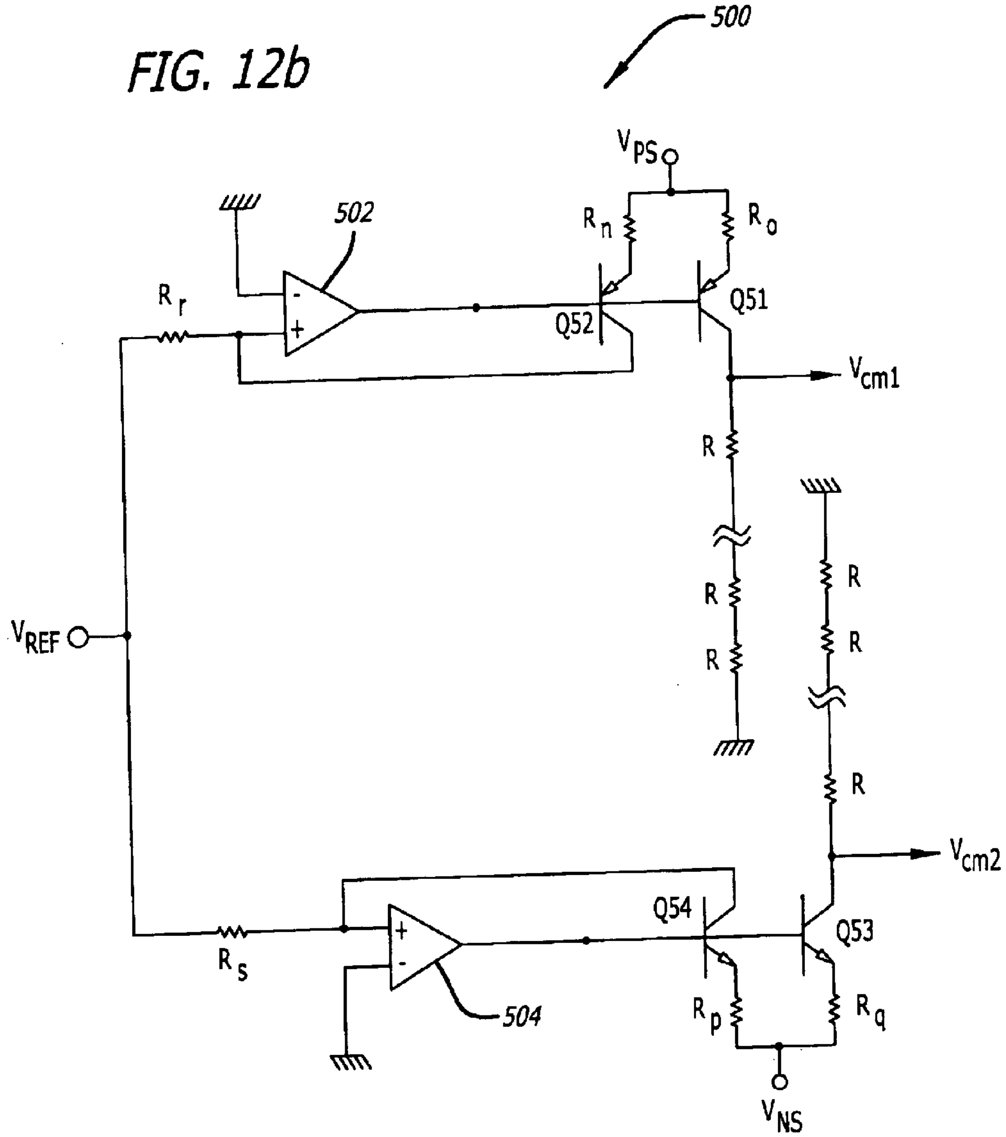
FIG. 12*b* is a schematic of an illustrative circuit for generating the voltages $V_{cm1}$ and $V_{cm2}$ for the circuit of FIG. 12*a*

FIG. 12*b* is a schematic of an illustrative circuit 500 for generating the voltages $V_{cm1}$ and $V_{cm2}$ for the circuit 450 of FIG. 12*a*, assuming $V_{in}$ is centered around ground. $V_{cm1}$ and $V_{cm2}$ are created off of the master current references and a replica of the ladders. The output of an op amp 502 is connected to the bases of two PNP transistors Q51 and Q52. The emitters of Q51 and Q52 are connected to a voltage supply $V_{PS}$ through resistors $R_o$ and $R_n$, respectively. The collector of Q51 is connected to a replica of half of the resistor ladder (the portion of the ladder that goes to the $V_{in}$ connection) connected to ground. The negative terminal of the op amp 502 is connected to ground and the positive terminal is connected to the collector of Q52 and to a voltage supply $V_{REF}$ through a resistor $R_r$. $V_{cm1}$ is output from the collector of Q51.

The output of an op amp 504 is connected to the bases of two NPN transistors Q53 and Q54. The emitters of Q53 and Q54 are connected to a voltage supply $V_{NS}$ through resistors $R_q$ and $R_p$, respectively. The collector of Q53 is connected to a replica of half of the resistor ladder (the portion of the ladder that goes to the $V_{in}$ connection) connected to ground. The negative terminal of the op amp 504 is connected to ground and the positive terminal is connected to the collector of Q54 and to $V_{REF}$ through a resistor $R_s$. $V_{cm2}$ is output from the collector of Q53.

One of ordinary skill in the art can design other control loops for trimming the differential ladder, such as using a single control loop and using mirror techniques, etc., to create the bias for the second set of current sources.

Returning to the flow chart of FIG. 8, after the quantizer 50 is trimmed (Step 252), at Step 254, trim one of the DACs 156 or 158 by measuring all of the DAC codes to find the highest value and trimming each of the DAC cells to that highest value. Only one of the complementary differential DACs needs to be trimmed (i.e., either the NPN DAC 156 or the PNP DAC 158, not both). In the illustrative embodiment, the PNP DAC 158 is set up to be untrimmed by design, so that only the NPN DAC 156 will be trimmed. One method for trimming a DAC is given by U.S. Pat. No. 5,973,631, entitled “Test circuit and method of trimming a unary digital-to-analog converter (DAC) in a subranging analog-to-digital converter (ADC)”. The DAC current can be trimmed by either laser trimming a resistor or providing a digitally programmable CMOS DAC current at the emitter of each DAC LSB (least significant bit) current source, or somewhere else in the current path (it is not confined to the emitter).

The DAC currents could be increased by adding an NMOS calibration DAC current. If the design is done utilizing resistor trimming, use the lowest DAC current as the reference and trim each cell down to that value. In the illustrative embodiment, each DAC cell should be trimmed or calibrated to a differential linearity of greater than 17 bits.

At Step 256, after the DAC linearity is trimmed (or calibrated), the overall DAC gain is trimmed to match the gain of the quantizer that is driving it. The DAC reference current can be adjusted identically to that described above for the complementary differential quantizer ladder. The DAC gain is adjusted to match the coarse quantizer gain, or vice versa. This can be measured by looking at the output residue from the summing amplifier 164.

Through these trims (Steps 252–256), the coarse quantizer 50 and DAC 156 of the first pass 202 of the multi-pass ADC 200 are trimmed or adjusted digitally. The next set of trims is for the next subranged stage 204.

At Step 258, after the first coarse pass 202 (first quantizer 50, DAC 156, and summing amplifier 164) is trimmed, the process (Steps 252–256) is repeated for any intermediate passes (in the illustrative embodiment, the second quantizer 50, DAC 156, and summing amplifier 164 of the second pass 204). In the illustrative embodiment, the DAC linearity in the second pass only needs to be trimmed to a differential linearity of 12 bits. The intermediate pass trim has one extra step: the intermediate pass residue gain needs to be trimmed to match one quantization Q-level of the previous subranged stage. For instance, the second pass residue gain needs to be trimmed to match one coarse Q-level. The DAC and quantizer gains are adjusted together to match the full scale range out of the summing amplifier for one coarse quantizer Q-level excursion at the ADC input.

Finally, at Step 260, trim the gain of the fine pass (third pass) quantizer 214 to match one quantization Q-level of the previous pass (second pass). This can be done as described above for the coarse quantizer gain trim. The quantizer gain trim for each subranged section, as well as the final fine quantizer, is corrected with the overall ADC in a SVT (sampling voltage tracker) loop. The gain reference for each quantizer is adjusted while the SVT moves between two coarse codes of the previous subranged stage while the voltage is monitored at the summing amplifier voltage output Depending on the final device and resistor matching of the process, the linearity of the 6-bit fine quantizer may have to be trimmed (requires 9-bits linearity) by either laser trimming resistors or through a CMOS DAC. Conversely, there is a chance that the 5-bit second pass DAC may be designed to achieve 12-bits linearity, meaning only its gain would have to be trimmed.

Thus, the present invention has been described herein with reference to a particular embodiment for a particular application. Those having ordinary skill in the art and access to the present teachings will recognize additional modifications, applications and embodiments within the scope thereof. For instance, although the illustrative embodiments presented were described using complementary bipolar technology, these concepts can be applied to any process technology without departing from the scope of the present teachings.

It is therefore intended by the appended claims to cover any and all such applications, modifications and embodiments within the scope of the present invention.

Accordingly,

What is claimed is:

1. A resistive network comprising:

input means for receiving an input signal;

a first ladder including a first plurality of serially connected resistors coupled to said input means; and a first pair of complementary current sources, including a first current source and a second current source, for maintaining a constant current flow through said first ladder, wherein said pair of current sources is implemented in one of complementary bipolar technology and CMOS technology, wherein if the pair of current sources is implemented in bipolar technology, said pair includes a PNP current source and a NPN current source, and wherein if the pair of current sources is implemented in CMOS technology, said pair includes a PMOS current source and a NMOS current source.

2. The invention of claim 1 wherein said first current source is connected to a first end of said ladder and said second current source is connected to a second end of said ladder.

3. The invention of claim 1 wherein the transit frequency $F_T$ of said first current source is on the same order as the transit frequency of said second current source.

4. The invention of claim 1 wherein said input means is coupled to the middle of said ladder.

5. The invention of claim 1 wherein said input signal is a differential signal.

6. The invention of claim 5 wherein said input means includes a positive terminal and a negative terminal for receiving said differential signal.

7. The invention of claim 6 wherein said first ladder is coupled to said positive terminal.

8. The invention of claim 7 wherein said resistive network further includes a second ladder comprising a second plurality of serially connected resistors coupled to said negative terminal.

9. The invention of claim 8 wherein said resistive network further includes a second pair of complementary current sources, including a third current source and a fourth current source, for maintaining a constant current flow through said second ladder.

10. The invention of claim 9 wherein said third current source is connected to a first end of said second ladder and said fourth current source is connected to a second end of said second ladder.

11. The invention of claim 9 wherein the transit frequency $F_T$ of said third current source is on the same order as the transit frequency of said fourth current source.

12. The invention of claim 9 wherein said second pair of current sources is implemented in complementary bipolar technology, said pair including a PNP current source and an NPN current source.

13. The invention of claim 9 wherein said second pair of current sources is implemented in CMOS technology, said pair including a PMOS current source and an NMOS current source.

14. The invention of claim 8 wherein said negative terminal is coupled to the middle of said second ladder.

15. A differential resistive network comprising:

positive and negative input terminals for receiving an analog differential input signal;

a first ladder including a first plurality of serially connected resistors coupled to said positive terminal;

a first pair of complementary current sources, including first and second current sources, for maintaining a constant current flow through said first ladder;

a second ladder including a second plurality of serially connected resistors coupled to said negative terminal; and a second pair of complementary current sources, including third and fourth current sources, for maintaining a constant current flow through said second ladder wherein said pair of current sources is implemented in one of complementary bipolar technology and CMOS technology, wherein if the pair of current sources is implemented in bipolar technology, said pair includes a PNP current source and a NPN current source, and wherein if the pair of current sources is implemented in CMOS technology, said pair includes a PMOS current source and a NMOS current source.

16. The invention of claim 15 wherein said first current source is connected to a first end of said first ladder and said second current source is connected to a second end of said first ladder.

17. The invention of claim 15 wherein said third current source is connected to a first end of said second ladder and said fourth current source is connected to a second end of said second ladder.

18. The invention of claim 15 wherein the transit frequencies $F_T$ of said current sources are of the same order.

19. The invention of claim 15 wherein said positive and negative terminals are coupled to the middle of said first and second ladders, respectively.

20. A differential quantizer comprising:

first and second input means for receiving a differential analog input signal;

a first resistive ladder having a first plurality of resistors coupled in series and connected to said first input means for receiving an input signal and providing a first plurality of voltage comparison signals;

a first pair of complementary current sources, including first and second current sources, for maintaining a constant current flow through said first resistive ladder;

a second resistive ladder having a second plurality of resistors coupled in series and connected to said second input means for receiving an input signal and providing a second plurality of voltage comparison signals;

a second pair of complementary current sources, including third and fourth current sources, for maintaining a constant current flow through said second resistive ladder;

comparator means for comparing the first plurality of voltage comparison signals tapped from said first resistive ladder with said second plurality of voltage comparison signals tapped from said second resistive ladder, and encoding means coupled to said comparator means for providing a digital output wherein said first pair of current sources is implemented in one of complementary bipolar technology and CMOS technology, wherein if the pair of current sources is implemented in bipolar technology, said pair includes a PNP current source and a NPN current source as first and second current sources, respectively, and wherein if the pair of current sources is implemented in CMOS technology, said pair includes a PMOS current source and a NMOS current source as first and second current sources, respectively.

21. The invention of claim 20 wherein said first current source is connected to a first end of said first ladder and said second current source is connected to a second end of said first ladder.

22. The invention of claim 20 wherein said third current source is connected to a first end of said second ladder and said fourth current source is connected to a second end of said second ladder.

23. The invention of claim 20 wherein the transit frequencies $F_T$ of said current sources are of the same order.

24. The invention of claim 20 wherein said first and second input means are coupled to the middle of said first and second ladders, respectively.

25. The invention of claim 20 wherein said comparator means includes a plurality of comparators.

26. A differential quantizer comprising:

first and second input means for receiving a differential analog input signal;

a first resistive ladder having a first plurality of resistors coupled in series and connected to said first input means for receiving an input signal and providing a first plurality of voltage comparison signals;

a first pair of complementary current sources, including first and second current sources, for maintaining a constant current flow through said first resistive ladder;

a second resistive ladder having a second plurality of resistors coupled in series and connected to said second input means for receiving an input signal and providing a second plurality of voltage comparison signals;

a second pair of complementary current sources, including third and fourth current sources, for maintaining a constant current flow through said second resistive ladder;

comparator means for comparing the first plurality of voltage comparison signals tapped from said first resistive ladder with said second plurality of voltage comparison signals tapped from said second resistive ladder; and encoding means coupled to said comparator means for providing a digital output, wherein said input means are offset from said comparator means by a pair of resistors on either side of each input means, said pairs of resistors having a resistance half that of the other resistors in said first and second ladders.

27. A method for quantizing an analog signal including the steps of:

receiving a differential analog input signal with a positive signal and a negative signal;

generating a first plurality of voltage comparison signals by inputting said positive signal to a first resistive ladder having a first plurality of resistors coupled in series;

maintaining a constant current flow through said first resistive ladder using a first pair of complementary current sources;

generating a second plurality of voltage comparison signals by inputting said negative signal to a second resistive ladder having a second plurality of resistors coupled in series;

maintaining a constant current flow through said second resistive ladder using a second pair of complementary current sources;

comparing the first plurality of voltage comparison signals with said second plurality of voltage comparison signals to provide output signals; and encoding said output signals to provide a digital output, wherein said first pair of current sources is implemented in one of complementary bipolar technology and CMOS technology, wherein if the pair of current sources is implemented in bipolar technology, said pair includes a PNP current source and a NPN current source, respectively, and wherein if the pair of current sources is implemented in CMOS technology, said pair includes a PMOS current source and a NMOS current source.

28. A summing node circuit comprising:

input means for receiving an input signal;

a pair of complementary digital to analog converters (DACs) for generating a reconstruction signal; and summing means for subtracting said reconstruction signal from said input signal to produce a residue signal, wherein said input signal is a differential signal.

29. The invention of claim 28 wherein said complementary DACs include an NPN DAC and a PNP DAC.

30. The invention of claim 29 wherein the transit frequency $F_T$ of said NPN device is on the same order as the transit frequency of said PNP device.

31. The invention of claim 28 wherein said input signal is a voltage signal.

32. The invention of claim 31 wherein said input means further includes a resistor for converting said input voltage to an input current signal.

33. The invention of claim 31 wherein said summing means includes a transresistance amplifier.

34. The invention of claim 28 wherein said input means includes positive and negative input terminals.

35. The invention of claim 34 wherein said positive input terminal is connected to a first resistor for generating a positive input current and said negative input terminal is connected to a second resistor for generating a negative input current.

36. The invention of claim 35 wherein each DAC generates two currents, a first current coupled to said positive input current at a first summing node, and a second current coupled to said negative input current at a second summing node.

37. The invention of claim 36 wherein said summing means includes a summing amplifier.

38. The invention of claim 37 wherein said first summing node is connected to a first input terminal of said summing amplifier and said second summing node is connected to a second input terminal of said summing amplifier.

39. A subranging analog to digital converter (ADC) comprising:

input means for receiving an analog input signal;

a coarse pass circuit including:

a sample and hold circuit for generating a sampled signal from said input signal;

a coarse quantizer for generating a first digital word from said sampled signal; and a summing node circuit including a pair of complementary DACs for generating an analog reconstruction signal of said first digital word and a summing amplifier for subtracting said reconstruction signal from said sampled input signal to produce a residue signal;

a fine pass circuit including a fine quantizer for generating a second digital word from said residue signal; and digital correction means for combining said first and second digital words to generate a digital output.

40. The invention of claim 39 wherein said complementary DACs include an NPN DAC and a PNP DAC.

41. The invention of claim 40 wherein said coarse pass circuit further includes complementary driver circuits for driving the complementary DACs using outputs from the coarse quantizer.

42. The invention of claim 41 wherein said complementary driver circuits include PNP transistors for driving said NPN DAC and NPN transistors for driving said PNP DAC.

43. The invention of claim 39 wherein said input signal is a differential input signal.

44. The invention of claim 43 wherein said coarse quantizer includes:

positive and negative input terminals for receiving a differential signal;

a first resistive ladder having a first plurality of resistors coupled in series and connected to said positive input terminal for receiving an input signal and providing a first plurality of voltage comparison signals;

a first pair of complementary current sources for maintaining a constant current flow through said first resistive ladder;

a second resistive ladder having a second plurality of resistors coupled in series and connected to said second input means for receiving an input signal and providing a second plurality of voltage comparison signals;

a second pair of complementary current sources for maintaining a constant current flow through said second resistive ladder;

comparator means for comparing the first plurality of voltage comparison signals tapped from said first resistive ladder with said second plurality of voltage comparison signals tapped from said second resistive ladder; and encoding means coupled to said comparator means for generating said first digital word.

45. The invention of claim 43 wherein said fine quantizer includes:

positive and negative input terminals for receiving a differential signal;

a first resistive ladder having a first plurality of resistors coupled in series and connected to said positive input terminal for receiving an input signal and providing a first plurality of voltage comparison signals;

a first pair of complementary current sources for maintaining a constant current flow through said first resistive ladder;

a second resistive ladder having a second plurality of resistors coupled in series and connected to said second input means for receiving an input signal and providing a second plurality of voltage comparison signals;

a second pair of complementary current sources for maintaining a constant current flow through said second resistive ladder;

comparator means for comparing the first plurality of voltage comparison signals tapped from said first resistive ladder with said second plurality of voltage comparison signals tapped from said second resistive ladder; and encoding means coupled to said comparator means for generating said second digital word.

46. The invention of claim 39 wherein said subranging ADC further includes one or more intermediate pass circuits coupled between said coarse and fine pass circuits, each intermediate pass circuit including:

input means for receiving a first residue signal from a previous circuit;

a sample and hold circuit for generating a sampled residue signal from said first residue signal;

an intermediate quantizer for generating a third digital word from said sampled residue signal; and a summing node circuit for subtracting an analog reconstruction of said third digital word from said sampled residue signal to produce a second residue signal.

47. The invention of claim 46 wherein said summing node circuit includes a pair of complementary DACs for generating a reconstruction signal of said third digital word and a summing amplifier for subtracting said reconstruction signal from said sampled residue signal to produce a second residue signal.

48. The invention of claim 46 wherein said intermediate quantizer includes:

positive and negative input terminals for receiving a differential signal;

a first resistive ladder having a first plurality of resistors coupled in series and connected to said positive input terminal for receiving an input signal and providing a first plurality of voltage comparison signals;

a first pair of complementary current sources for maintaining a constant current flow through said first resistive ladder;

a second resistive ladder having a second plurality of resistors coupled in series and connected to said second input means for receiving an input signal and providing a second plurality of voltage comparison signals;

a second pair of complementary current sources for maintaining a constant current flow through said second resistive ladder;

comparator means for comparing the first plurality of voltage comparison signals tapped from said first resistive ladder with said second plurality of voltage comparison signals tapped from said second resistive ladder; and encoding means coupled to said comparator means for generating said third digital word.

49. A method for generating a residue signal from an analog input signal and a quantizer output in a subranging ADC including the steps of:

receiving said input signal;

generating a reconstruction signal from said quantizer output using a pair of complementary DACs; and subtracting said reconstruction signal from said input signal to produce a residue signal, wherein said input signal is a differential signal.

50. A method for trimming a differential ladder quantizer, said quantizer comprising a first resistive ladder, a first pair of complementary current sources, including first and second current sources, for maintaining a constant current flow through said first resistive ladder, a second resistive ladder, and a second pair of complementary current sources, including third and fourth current sources, for maintaining a constant current flow through said second resistive ladder, said method including the steps of:

adjusting the current through said first current source to match said third current source; and adjusting the current through said second current source to match said fourth current source.

51. The invention of claim 50 wherein said currents are adjusted by laser trimming resistors coupled to the emitters of said current sources.

52. The invention of claim 50 wherein said currents are adjusted by using a programmable CMOS DAC connected to the emitters of said current sources.

53. The invention of claim 50 wherein said method further includes adjusting the overall gain of the quantizer.

54. The invention of claim 53 wherein said overall gain is adjusted by using a circuit for generating biasing voltages for said current sources.

55. The invention of claim 54 wherein said overall gain is adjusted by laser trimming one or more resistors in said circuit.

56. The invention of claim 54 wherein said overall gain is adjusted by using a programmable CMOS DAC to inject a current into said circuit.

57. A method for trimming a subranging ADC, said ADC comprising a coarse quantizer that quantizes an input signal and provides a first digital word, a pair of complementary DACs that generate a reconstruction of said first digital word, a summing amplifier that subtracts said reconstruction from said input signal to produce a residue signal, and a fine quantizer that quantizes said residue signal and provides a second digital word that is combined with said first digital word to form an output word, said method including the steps of:

trimming each of the DAC cells on one of the complementary DACs;

after the DAC cells are trimmed, trimming the overall DAC gain to match the gain of the coarse quantizer; and trimming the gain of the fine quantizer to match one quantization Q level of the previous subranged stage.

58. The invention of claim 57 wherein said coarse quantizer includes complementary current sources.

59. The invention of claim 58 wherein said method further includes the step of trimming the complementary current sources of the coarse quantizer to match each other, prior to trimming the overall DAC gain.

60. The invention of claim 57 wherein said trims are accomplished by trimming thin film resistors.

61. The invention of claim 57 wherein said trims are accomplished by adjusting CMOS calibration DACs.

62. The invention of claim 57 wherein said subranging ADC further includes one or more intermediate subranged stages coupled between said coarse summing amplifier and said fine quantizer, each intermediate stage comprising:

an intermediate differential ladder quantizer with complementary current sources that quantizes an input residue signal and provides a third digital word;

a pair of complementary DACs that generate a reconstruction of said third digital word; and a summing amplifier that subtracts said reconstruction from said input residue signal to produce an intermediate pass residue signal.

63. The invention of claim 62 wherein said method further includes trimming said intermediate stages before trimming said fine quantizer.

64. The invention of claim 63 wherein each intermediate stage is trimmed by:

trimming the complementary current sources of the intermediate quantizer to match each other;

trimming each of the DAC cells on one of the complementary DACs of said intermediate stage;

after the DAC cells are trimmed, trimming the overall DAC gain to match the gain of the quantizer driving it; and trimming the intermediate pass residue gain to match one quantization Q level of the previous subranged stage.

* * * * *